US012772392B2

(12) United States Patent
Snygg et al.

(10) Patent No.: US 12,772,392 B2
(45) Date of Patent: Oct. 20, 2026

(54) METHOD AND APPARATUS FOR TEMPERATURE AND HUMIDITY CONTROL IN AN ELECTRICAL ENCLOSURE

(71) Applicant: Telefonaktiebolaget LM Ericsson (publ), Stockholm (SE)

(72) Inventors: Göran Snygg, Partille (SE); Daniel Sjöberg, Mölndal (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 217 days.

(21) Appl. No.: 18/277,135

(22) PCT Filed: Feb. 15, 2021

(86) PCT No.: PCT/EP2021/053639
§ 371 (c)(1),
(2) Date: Aug. 14, 2023

(87) PCT Pub. No.: WO2022/171310
PCT Pub. Date: Aug. 18, 2022

(65) Prior Publication Data
US 2024/0130056 A1 Apr. 18, 2024

(51) Int. Cl.
*H05K 5/02* (2006.01)

(52) U.S. Cl.
CPC ......... *H05K 5/0212* (2022.08); *H05K 5/0214* (2022.08); *H05K 5/0247* (2013.01)

(58) Field of Classification Search
CPC ... H05K 5/0212; H05K 5/0214; H05K 5/0247
See application file for complete search history.

(56) References Cited

U.S. PATENT DOCUMENTS 4,852,469 A * 8/1989 Chuang .............. B60H 1/00785 454/75
7,320,457 B2 * 1/2008 Heim .................... F04B 35/045 251/129.06
2012/0130545 A1 * 5/2012 Haugh .................... G06F 1/203 700/276
2013/0278120 A1 10/2013 Elkins
2017/0092405 A1 * 3/2017 Manahan ................. H05K 7/20
2017/0094833 A1 3/2017 Pitwon et al.
2018/0199453 A1 7/2018 Linderman
2020/0313132 A1 10/2020 Rangelov et al.

OTHER PUBLICATIONS

International Search Report and Written Opinion with Transmittal dated Oct. 28, 2021 issued in International Patent Application No. PCT/EP2021/053639 (12 pages).

* cited by examiner

*Primary Examiner* — Mukundbhai G Patel
(74) *Attorney, Agent, or Firm* — Rothwell, Figg, Ernst & Manbeck, P.C.

(57) ABSTRACT

The present invention relates to a method and apparatus that employs an opening/closing mechanism for controlling temperature and humidity in an electrical enclosure. The electrical enclosure comprises a first and a second vent hole, wherein the second vent hole is further a drain hole. The vent holes both comprise an opening/closing mechanism that can be controlled based on sensor data obtained inside and/or outside the electrical enclosure.

11 Claims, 5 Drawing Sheets

METHOD AND APPARATUS FOR TEMPERATURE AND HUMIDITY CONTROL IN AN ELECTRICAL ENCLOSURE

CROSS REFERENCE TO RELATED APPLICATIONS

This application is a 35 U.S.C. § 371 National Stage of International Patent Application No. PCT/EP2021/053639, filed Feb. 15, 2021.

TECHNICAL FIELD

The present invention relates to a method and apparatus that employs an opening/closing mechanism for controlling temperature and humidity in an electrical enclosure.

BACKGROUND

Telecommunication equipment is typically installed and operated outdoors. Products aimed for outdoor use are continuously exposed to different weather conditions, which can often become a serious problem as most electronics are sensitive to both high temperatures and humidity. The problem may be especially prevalent in locations having large temperature variations and/or heavy precipitation.

Water can cause severe damages on both passive and active components, e.g. resistors, capacitors, transistors, and integrated circuits. Several types of damages can occur, such as electrical short circuits, corrosion, etc. Strategies to limit the risk for these include special component packaging, electrical enclosures, indoor placement, and heating systems.

Another trend is to reduce the size of telecommunication equipment, which leads to higher temperatures inside the enclosure. Heat is a problem as basically all electrical components have their operating lifetime reduced with higher temperature. For most types of components, the aging accelerates with higher temperatures. A 10-degree difference around 20 degrees Celsius has less impact on lifetime than 10-degree difference around 70 degrees Celsius. Therefore, it is of importance to avoid high peak temperatures during operation. High temperatures could also lead to a sudden breakdown phenomenon when maximum rating for a component is reached. A combination of aging and poor derating might also cause this type of malfunction.

There are several known solutions for temperature and humidity control of electrical enclosures. For cooling it is common to use a fan that provides an airflow through the enclosure. This solution requires some type of indoor environment to avoid water penetration and fans add additional costs and have limited lifetime. Another solution without fans is based on vent holes that allow airflows around the electronics, but this solution has the drawback of not providing much protection against water penetration.

Another approach is to use a sealed enclosure in metal where the generated heat dissipates through conduction. The enclosure can also be equipped with in cooling flanges to improve heat transfer. This solution is relatively expensive as it requires hermitical seals to avoid humidity penetration and water damage. Another major issue with sealed enclosures is that it is hard to remove humidity/water that has managed to penetrate the enclosure. Long-term moisture around electronics is known to cause damages. To mitigate this problem a reasonably sealed enclosure that can drain out water is sometimes used. FIG. 1 illustrates a reasonably sealed electrical enclosure with a drain hole. However, a general disadvantage of sealed structures is that they do not allow for air cooling.

In view of the above, there is a need to provide an electrical enclosure for outdoor use that can combine air cooling with sealed enclosures that can largely avoid water penetration.

SUMMARY

It is an object of the present invention to remedy, or at least alleviate, some of these drawbacks and to provide an electrical enclosure that improves the temperature and humidity control.

According to a first aspect, the invention describes an electrical enclosure for outdoor use. The electrical enclosure comprises a first vent hole and a second vent hole, wherein the first and second vent holes both comprise an opening/closing mechanism. The second vent hole is further a drain hole disposed on the bottom side of the enclosure. The electrical enclosure comprises at least one sensor configured to provide sensor data, and wherein the sensor data at least comprises the temperature inside the enclosure. The electrical enclosure further comprises a control unit configured to control the operation of the opening/closing mechanism of the first and second vent holes, in which the opening/closing of the vent holes are determined based on the sensor data. The opening/closing mechanism of the first and second vent holes may use an electroactive polymer that expands in size under an applied voltage to form a seal.

According to a second aspect, the invention describes a method for temperature and humidity control in an electrical enclosure. The enclosure comprises a first vent hole and a second vent hole, and the second vent hole is further a drain hole and disposed on the bottom side of the enclosure. The method is comprising the step of reading sensor data from at least one sensor, wherein the sensor data comprises at least one of temperature, humidity, water detection inside the enclosure and rain detection outside the enclosure. The method is further comprising the step of controlling the opening/closing mechanism of the first and second vent holes based on the sensor data.

The above electrical enclosure and method improve the temperature and humidity control by combining air cooling with a reasonably sealed enclosure that avoids water penetration.

The drawings are not necessarily to scale and the dimensions of certain features may have been exaggerated for the sake of clarity, emphasis is instead being placed upon illustrating the principle of the embodiments herein.

DETAILED DESCRIPTION

Two embodiments of the present invention are described in detail below with reference to FIGS. 2-4. A first embodiment of the invention relates to an electrical enclosure 20 for outdoor use. A second embodiment relates to a method for temperature and humidity control in an electrical enclosure 20. It should be noted that the scope of the present invention is not limited to the particular embodiments described herein, but only limited by the appended claims.

The present invention relates to a method and apparatus that employs an opening/closing mechanism for controlling temperature and humidity in an electrical enclosure. The invention is preferably used for outdoor telecommunication equipment but may also be used for any type of electronic equipment that need an electrical enclosure with temperature and humidity control.

In the following, features of the first embodiment are described with reference to FIGS. 2, 3A and 3B. The first embodiment relates to an electrical enclosure 20 configured for controlling temperature and humidity inside the electrical enclosure.

Figure 1:
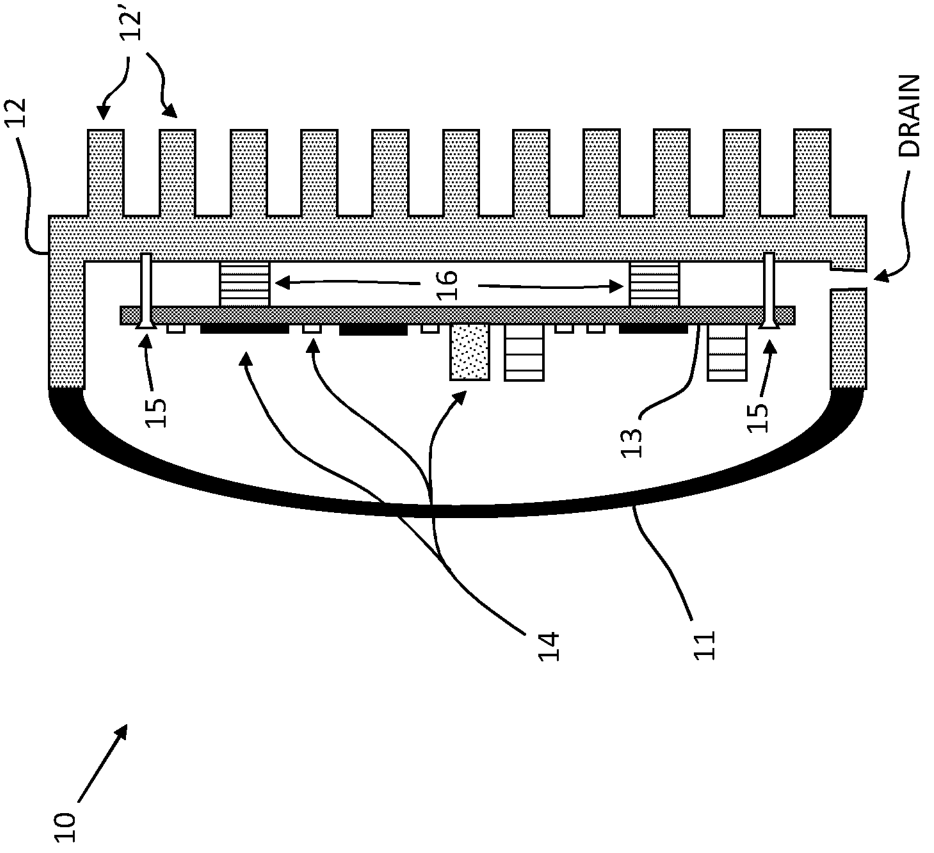
FIG. 1 (PRIOR ART)
FIG. 1 shows a known sealed electrical enclosure with a drain hole.
Figure 2:
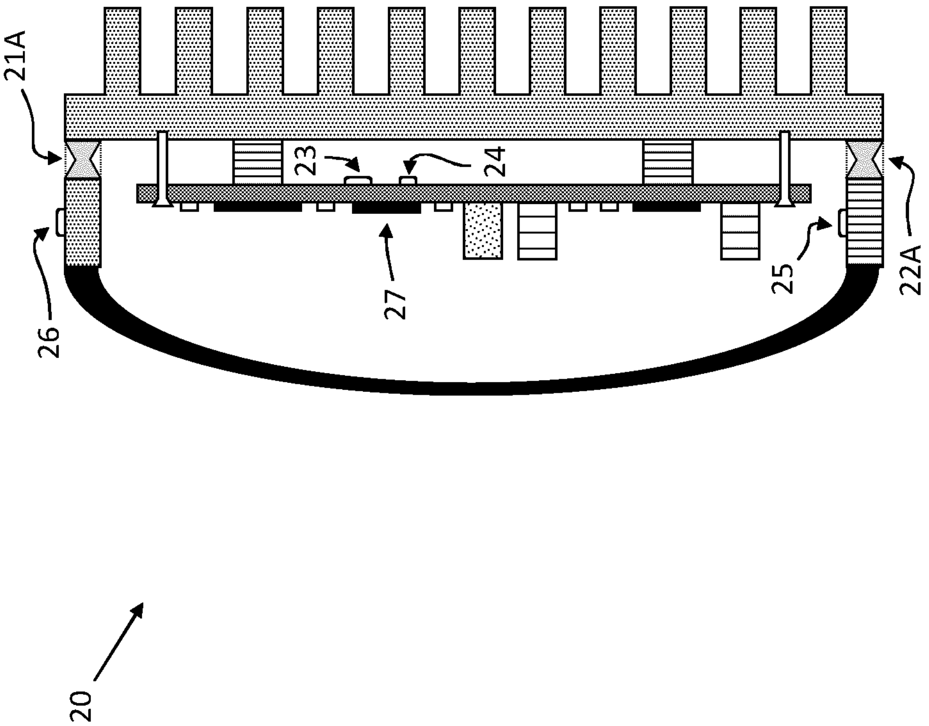
FIGS. 2-3 show examples of the invention according to the first embodiment.

Several of the elements present in the known electrical enclosure 10 of FIG. 1 may also be present in the embodiment of FIG. 2. For example, a cover 11 that seals the electrical enclosure by connecting directly or via a gasket to the frame 12 or body of the electrical enclosure, a circuit board 13 comprising electrical components 14 such as resistors, capacitors, transistors and integrated circuits, screws 15 for holding the circuit board to the frame of the electrical enclosure, and heat sinks 16 that thermally connect one or several of the electrical components 14 to the frame of the electrical enclosure. The heat sinks are preferably made of aluminium, copper, or any other thermally conductive material. Likewise, the frame 12 of the electrical enclosure is suitably of a metal with high thermal conductivity. The metal frame 12 may further be equipped with cooling flanges 12' to improve heat transfer.

Figure 3B:
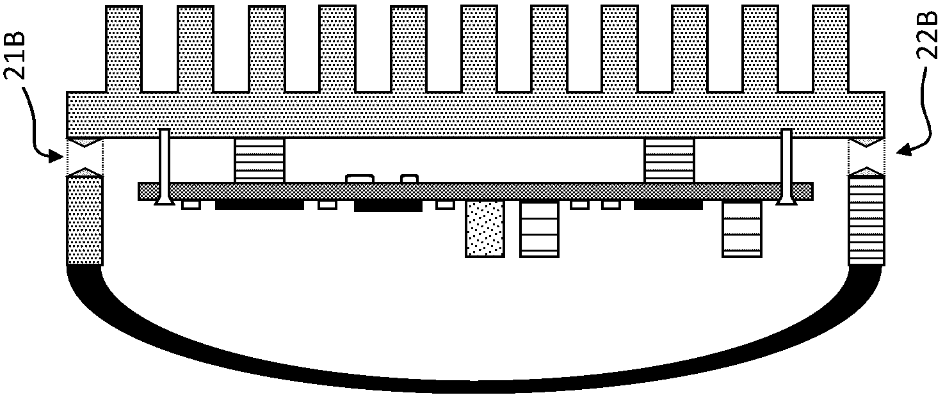
Figure 3A:
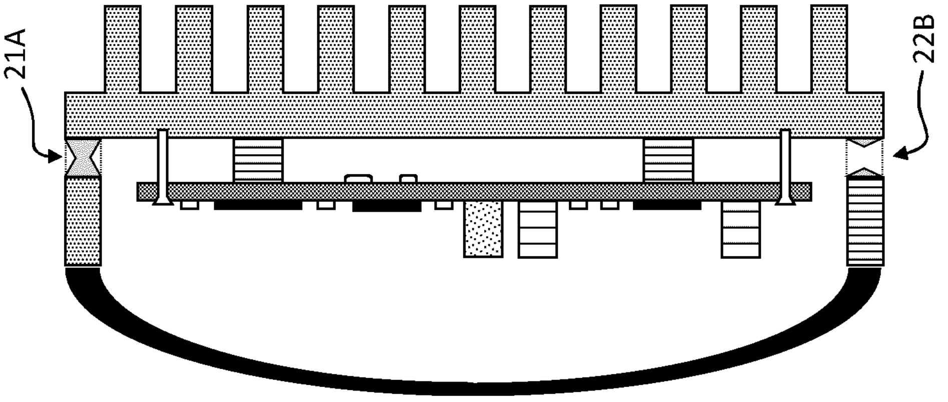
Figure 4:
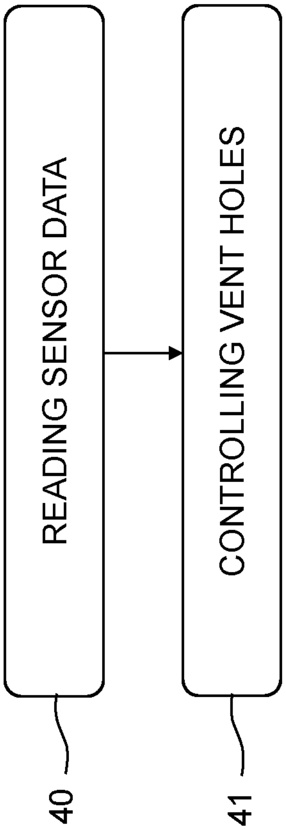
FIG. 4 shows schematically in a flowchart a method according to the second embodiment of the invention.

FIGS. 2, 3A and 3B depict an electrical enclosure 20 in accordance with the first embodiment. The electrical enclosure 20 is suitable for outdoor use but may also be used in other types of environments, e.g. indoors. The electrical enclosure 20 comprises a first vent hole 21A, 21B and a second vent hole 22A, 22B, wherein the first and second vent holes both comprise an in opening/closing mechanism and the second vent hole is further a drain hole disposed on the bottom side of the enclosure. The first and second vent holes may be configured to be closed 21A, 22A, or opened 21B, 22B. Preferably, the default state for the first and second vent holes are closed 21A, 22A. The bottom side here refers to lowermost part of the electrical enclosure during operation, thus allowing water to drain out of the electrical enclosure when the second vent hole is open 22B. Preferably, the first and second vent holes are disposed on opposite sides of the enclosure, i.e. bottom and the top side. This configuration takes advantage of the chimney effect to cool the inside of the electrical enclosure. The chimney effect may be further improved by adding vertical cooling flanges inside the electrical enclosure.

The electrical enclosure 20 comprises at least one sensor 23, 24, 25, 26 configured to provide sensor data, and wherein the sensor data at least comprises the temperature inside the enclosure, obtained from a temperature sensor 23. For improved temperature control an additional temperature sensor on the outside of the enclosure may be added. The sensor data may also comprise the humidity inside the enclosure, obtained from a humidity sensor 24. The sensor data may further comprise water detection data indicating if water is detected inside the enclosure, obtained from a water detection sensor 25. Additionally, the sensor data may yet further comprise rain detection data, obtained from a rain detection sensor 26 outside the enclosure.

The electrical enclosure 20 comprises a control unit 27 for controlling the opening/closing mechanism of the first and second vent holes. The control unit may be implemented as a microcontroller or as any other type of programmable logic or integrated circuit. Alternatively, the control unit may be implemented remotely. The control unit is connected, physically or wirelessly, to the opening/closing mechanisms of the first and second vent holes 21A, 21B, 22A, 22B. The control unit is further configured to control the operation in of the opening/closing mechanism of the first and second vent holes based on the sensor data. For example, the control unit may be configured to open the first and the second vent holes 21B, 22B when the temperature inside the enclosure is above a predetermined temperature threshold, providing an airflow through the enclosure and thus avoiding overheating. High humidity might be an indication of water inside the electrical enclosure. Hence, in another example, the control unit 27 may be configured to open the second vent hole 22B, or both vent holes 21B, 22B, to drain out water, when the humidity inside the electrical enclosure is above a predetermined humidity threshold. In yet another example, the control unit may be configured to open the second vent hole 22B when the water detection sensor indicates water inside the enclosure. The control unit may yet further be configured to close the first vent hole 21A when the rain detection sensor 26 indicates rain outside the electrical enclosure. The above described variants of the first embodiment show how sensor data and the control unit enable an improved air cooling and protection against water penetration.

The opening/closing mechanism of the first and second vent holes 21A, 21B, 22A, 22B of the electrical enclosure 20 preferably uses an electroactive polymer that expands in size under an applied voltage to form a seal, thus allowing the control unit 27 to control whether each vent hole is opened 21B, 22B or closed 21A, 22A. The expanded electroactive polymer provides a reasonably sealed enclosure that can avoid water penetration. The electroactive polymer may also be combined with a gasket to further improve the seal of the closed vent hole 21A, 22A.

In the following, features of the second embodiment are described with reference to FIG. 4. The second embodiment relates to a method that employs an opening/closing mechanism for controlling temperature and humidity in an electrical enclosure 20.

The method is performed for an electrical enclosure, the electrical enclosure comprising a first vent hole 21A, 21B and a second vent hole 22A, 22B, wherein the second vent hole is further a drain hole and disposed on the in bottom side of the enclosure.

The method comprises the step of reading 40 sensor data from at least one sensor 23, 24, 25, 26, wherein the sensor data comprises at least one of temperature data, humidity data, water detection inside the enclosure and rain detection outside the enclosure. Alternatively, the sensor data always comprises temperature data.

The method further comprises the step of controlling 41 an opening/closing mechanism for the first and second vent holes 21A, 21B, 22A, 22B based on said sensor data. The step of controlling 41 may comprise opening the first and the second vent holes 21B, 22B when the temperature inside the enclosure is above a predetermined temperature threshold. The controlling 41 may also comprise opening the second vent hole 22B, or both vent holes 21B, 22B, when the humidity inside the enclosure is above a predetermined humidity threshold, as this may be an indication of water inside the enclosure. The controlling 41 may further comprise opening the second vent hole 22B when a water detection sensor 25 indicates water inside the enclosure. The controlling 41 may yet further comprise closing the first vent hole 21A when the rain detection sensor 26 indicates rain outside the enclosure.

According to another aspect, the invention relates to one or several structures in electroactive polymers that control the vent holes of the electrical enclosure. Electroactive polymers are used in artificial muscles for its ability to change size or shape when stimulated by an electric field. Hence, it is possible to use electroactive polymers to control the opening/closing mechanism of the vent hole. Airflows inside the enclosure can then be controlled by opening and closing the first and/or second vent holes. With a vent hole on the bottom and another vent hole on the top of the enclosure, the airflow can be further improved by the so-called chimney effect. The need in of extended cooling occurs normally during high peak temperatures. When it is raining the temperature is significantly lower and there is often no need of extended cooling. In fact, rain gives the electrical enclosure additional cooling capacity due to its cooling effect. With a temperature sensor inside the housing the control unit can determine whether the vent holes need to open or stay closed. By using external and/or internal humidity sensors, the humidity rate can be monitored, and the control unit can be configured to determine whether the vent holes need to open or stay closed. In one example, the vent holes are open to provide an airflow through the enclosure as long as the outside air is dry. In another example, the control unit opens the second vent hole to drain out water that has penetrated the electrical enclosure when the internal humidity sensor indicates humidity rate above a predetermined threshold. This may further be done in a controlled way when the temperature conditions are optimal.

Figure 5:
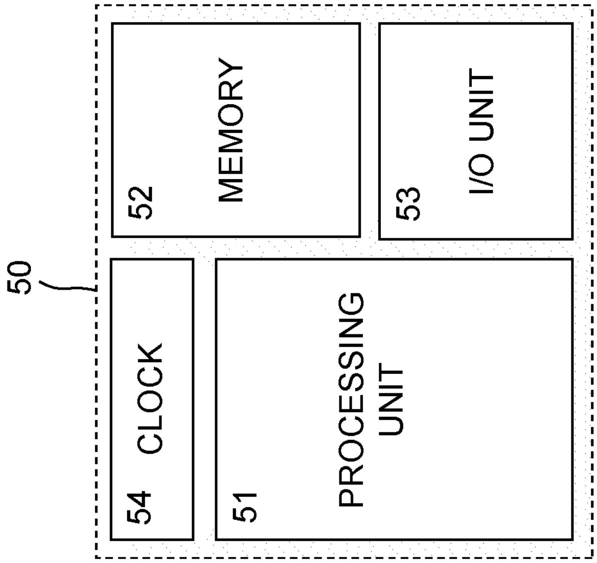
FIG. 5 shows schematically an example of a hardware implementation of the present invention.

According to yet another aspect of the invention, the control unit 27 may be implemented as a processing unit 51, a memory 52, input/output unit 53 and a clock 54 as is illustrated in FIG. 5. The processing unit 51, the memory 52, the I/O unit 53 and the clock 54 may be interconnected. The processing unit 51 may comprise a central processing unit, a digital signal processor, a multiprocessor system, programmable logic, a field programmable gate array (FPGA) or an application specific integrated circuit (ASIC) or any other type of logic. The memory 502 may comprise random access memory (RAM), read only memory (ROM) or any other type of volatile or non-volatile memory. The I/O unit 53 may comprise circuitry for output control signals and may further be connected, physically or wirelessly, to the opening/closing mechanisms of the first and second vent holes 21A, 21B, 22A, 22B.

It should be emphasized that the term "comprises/comprising" when used in this specification is taken to specify the presence of stated features, integers, steps or components, but does not preclude the presence or addition of one or more other features, integers, steps, components or groups thereof. It should also be noted that the words "a" or "an" preceding an element do not exclude the presence of a plurality of such elements.

The invention claimed is:

1. An electrical enclosure for outdoor use, the electrical enclosure comprising:

a first vent hole comprising a first opening/closing mechanism;

a second vent hole comprising a second opening/closing mechanism, wherein the second vent hole is further a drain hole disposed on the bottom side of the enclosure;

at least a first temperature sensor configured to provide sensor data indicating a temperature inside the enclosure;

at least a first rain sensor configured to sense the presence of rain outside of the electrical enclosure and to output data indicating an amount of rain detected outside the enclosure; and a control unit configured to control the operation of the first and second opening/closing mechanisms based on i) the sensor data indicating the temperature inside the enclosure and ii) an output of the rain sensor, wherein the control unit is configured to close the first vent hole and open the second vent hole as a result of the control unit determining that i) based on the sensor data provided by the first temperature sensor, the temperature inside the enclosure is above a predetermined temperature threshold and ii) based on the data output by the first rain sensor, the amount of rain outside the enclosure is above a predetermined rain threshold.

2. The electrical enclosure of claim 1, wherein opening/closing mechanism of the first and second vent holes uses an electroactive polymer that expands in size under an applied voltage to form a seal.

3. The electrical enclosure of claim 1, wherein the electrical enclosure further comprises a humidity sensor for detecting the level of humidity inside the enclosure.

4. The electrical enclosure of claim 3, wherein the control unit is configured to open the second vent hole when the humidity inside the enclosure is above a predetermined humidity threshold.

5. The electrical enclosure of claim 1, wherein the electrical enclosure further comprises a water sensor for indicating if water is detected inside the enclosure.

6. The electrical enclosure of claim 5, wherein the control unit is configured to open the second vent hole when the water detection sensor indicates water inside the enclosure.

7. The electrical enclosure of claim 1, wherein the first and second vent holes are disposed on opposite sides of the enclosure.

8. A method for temperature and humidity control in an electrical enclosure, the enclosure comprising a first vent hole and a second vent hole, wherein the second vent hole is further a drain hole and disposed on the bottom side of the enclosure, the method comprising the steps of:

reading sensor data from a temperature sensor;

reading sensor data from a rain sensor, wherein the sensor data from the rain sensor indicates an amount of rain outside the enclosure; and controlling an opening/closing mechanism of the first and second vent holes based on the sensor data from the temperature sensor and the sensor data from the rain sensor, wherein the sensor data from the temperature sensor indicates a temperature inside the enclosure, and controlling the opening/closing mechanism of the first and second vent holes based on the sensor data from the temperature sensor and the rain sensor comprises: closing the first vent hole and opening the second vent hole as a result of determining that the temperature inside the enclosure is above a predetermined temperature threshold and the amount of rain outside the enclosure is above a predetermined rain threshold.

9. The method of claim 8, wherein the method further comprises:

reading sensor data from a humidity sensor; and controlling the opening/closing mechanism of the first and second vent holes based on the sensor data from the humidity sensor, wherein the sensor data from the humidity sensor indicates a humidity inside the enclosure, and controlling the opening/closing mechanism of the first and second vent holes based on the sensor data from the humidity sensor comprises opening the first and/or the second vent holes as a result of determining that the humidity inside the enclosure is above a predetermined humidity threshold.

10. The method of claim 8, wherein the method further comprises:

reading sensor data from a liquid sensor; and controlling the opening/closing mechanism of the first and second vent holes based on the sensor data from the liquid sensor, wherein the sensor data from the liquid sensor indicates an amount of liquid inside the enclosure, and controlling the opening/closing mechanism of the first and second vent holes based on the sensor data from the liquid sensor comprises opening the first and/or the second vent holes as a result of determining that the amount of liquid inside the enclosure is above a predetermined liquid threshold.

11. The method of claim 1, wherein the control unit controls the operation of the first and second opening/closing mechanisms in order to regulate airflow through the enclosure to avoid overheating.

* * * * *